United States Patent [19]
Wik et al.

[11] Patent Number: 5,903,505
[45] Date of Patent: May 11, 1999

[54] METHOD OF TESTING MEMORY REFRESH OPERATIONS WHEREIN SUBTHRESHOLD LEAKAGE CURRENT MAY BE SET TO NEAR WORST-CASE CONDITIONS

[75] Inventors: Thomas R. Wik, Livermore; Tuan Phan, San Jose; Thien Trieu, Fremont, all of Calif.

[73] Assignee: LSI Logic Corporation, Milpitas, Calif.

[21] Appl. No.: 08/858,271

[22] Filed: May 19, 1997

[51] Int. Cl.$^6$ ...................................................... G11C 7/00
[52] U.S. Cl. .......................................... 365/222; 365/201
[58] Field of Search ..................................... 365/222, 201

[56] References Cited

U.S. PATENT DOCUMENTS 5,566,117  10/1996  Okamura et al. ........................ 365/222

*Primary Examiner*—David C. Nelms
*Assistant Examiner*—Trong Phan
*Attorney, Agent, or Firm*—Conley, Rose & Tayon, PC; B. Noel Kivlin

[57] ABSTRACT

A method for testing refresh operations of a memory array wherein subthreshold leakage current may be set to near worst-case conditions. The memory array includes a first row of memory cells having a first memory cell configured to store a first memory value, and a second row of memory cells having a second memory cell configured to store a second memory value. The method comprises storing a logic high value to the first memory cell as the first memory value, followed by storing a logic low value to the second memory cell as the second memory value. The method further comprises repeatedly driving a write bit line coupled to both the first and second memory cells at a logic low level for a period of a time equal to a refresh interval corresponding to the first memory cell. Additionally, the method includes subsequently reading the first memory value from the first memory cell. Finally, the method includes indicating that the first memory cell is operating correctly if the first memory value is still equal to a logic high value, or indicating that the first memory value is malfunctioning if the first memory value is equal to a logic low value. Driving the write bit line low may be accomplished by repetitively reading the second memory cell. The same effect may alternately be achieved by repetitively writing a logic low value to the second memory cell. By keeping the write bit line at a logic low level during testing of refresh operations, the subthreshold leakage current through the write transistor of the first memory cell may be increased. This accelerates the discharge of the first memory value, and insures testing is performed near worst-case conditions.

17 Claims, 3 Drawing Sheets

METHOD OF TESTING MEMORY REFRESH OPERATIONS WHEREIN SUBTHRESHOLD LEAKAGE CURRENT MAY BE SET TO NEAR WORST-CASE CONDITIONS

BACKGROUND OF THE INVENTION

1. Field of the Invention

This invention relates to the field of digital electronic memory devices, and in particular to testing of memory refresh operations.

2. Description of the Related Art

Memory devices are used in digital computer systems to store and retrieve electronic data at high speeds. Each item of data in memory, called a bit, is stored in a separate circuit or device known as a cell. Since computers use binary format to represent data, each cell can store one of two possible values (on or off). A typical memory system contains millions of bits organized as an array consisting of horizontal rows and vertical columns. Each cell shares electrical connections with the other cells in its row and column. The horizontal lines connected to all cells in a row are called word lines, and the vertical lines (along which data flows into and out of the cell) are called data or bit lines. Cells are therefore accessed by proper selection of the word and bit lines.

Several different types of memory are found in digital computers, one of which is dynamic random access memory (DRAM). Random-access memory is flexible in that it allows both the retrieval and storage of data to be performed quickly (as compared to Read-only Memory, or ROM). Dynamic RAM differs from static RAM (SRAM) in that it stores a value in a memory cell by either charging or discharging a capacitor. The cell retains its value only as long as the capacitor remains charged (typically a few milliseconds). Therefore, the capacitor in the cell needs to be periodically recharged, or refreshed. SRAMs, on the other hand, retain a value in a cell until either another value is stored or the power supply is interrupted.

DRAMs, while typically slower than SRAMs, are less expensive and are generally used to implement large arrays in a computer system, such as main memory. DRAMs are less expensive than SRAMs because their memory cells are designed to be as simple as possible. Sacrificing circuitry for compactness, though, results in a less robust output signal from the cell. Peripheral logic such as sense amplifiers, memory registers, and output drivers is needed to properly restore the electrical characteristics of the cell's output to be compatible with the rest of the system. Reliability is also an issue when dealing with a dynamically stored value. Although the refresh operation is designed to periodically recharge a cell's storage element, some memory cells in the array may be weak in the sense of holding charge. If the storage element in a cell discharges too quickly, it will result in a loss of that data bit.

One implementation of a compact DRAM design is the three-transistor memory cell (3T cell). The 3T cell includes a storage transistor, which maintains the value of the cell, a read transistor for retrieving the value of the cell, and a write transistor, for storing a value into the cell. One type of transistor that can be used in this cell is the Metal-Oxide-Silicon Field-Effect Transistor (MOSFET). A MOSFET has a gate terminal separated from a silicon substrate by a thin layer of insulating material. Furthermore, the MOSFET has a channel extending between two diffused regions in the substrate, called the source terminal and the drain terminal. The fourth terminal, the substrate, is typically held at a non-conducting voltage. The source and drain are electrically disconnected unless a voltage potential from the transistor's gate to its source ($V_{GS}$) surpasses a threshold voltage ($V_T$) characteristic of the transistor. In this case, current begins to flow between the source and drain. When $V_{GS}$ is less than $V_T$, the current flowing in the channel (known as the subthreshold leakage current) is considerably smaller than when $V_{GS}$ is greater than $V_T$.

To understand the causes of subthreshold leakage current, the structure and operation of a MOSFET must be considered. The source and drain terminals of the transistor each form a reverse-biased junction with the substrate. At values of $V_{GS}$ below $V_T$, these terminals are electrically disconnected from one another. At each of these junctions, one side of the junction has more positive charge carriers, and the other has more negative carriers. This heavy concentration of charge carriers is called doping. (In an n-channel transistor, the source and drain are negatively doped, and the substrate is positively doped). When these two regions come into contact, the differing charge concentrations cause a flow of negative carriers to the positively-charged region and a flow of positive carriers to negatively-charge region. As the carriers move about, an electric field is built up between the two regions. Eventually, an equilibrium is reached in which the electric field exactly balances the tendency of the charge carriers to migrate. A potential barrier is thus erected between the two types of materials that prevents current from flowing. Furthermore, a region is built up at the junction that is almost entirely devoid of any charge carriers. This area is known as the depletion region.

In large geometry MOSFETs, the potential barrier across the depletion region is great enough to restrict most leakage current. The electric fields created by the source-substrate junction and the drain-substrate junction are far enough part so that one field does not sufficiently lower the barrier enough to produce current injection. This is true even as drain voltage ($V_D$) is increased, for in long-channel devices, the leakage current is substantially independent of the drain-source voltage $V_{DS}$.

In short-channel transistors, however, an effect called drain-induced barrier lowering (DIBL) becomes important. DIBL results when the drain is sufficiently close to the source, such that the electric field caused by the drain-substrate junction lowers the source barrier enough so that current will flow. There are two components to DIBL. First, even if $V_{DS}$ is zero, the channel might be short enough such that there is overlap between the depletion regions of the drain and source terminals. This effect by itself may be enough to induce current flow. Secondly, as $V_{DS}$ is increased, the electric field of the drain junction may extend into the source region, again lowering the potential barrier. The subthreshold leakage current also has an exponential dependence on $V_G$ (and hence, $V_{GS}$). As $V_{GS}$ increases, attracting more charge carriers to the channel, more current will flow.

In large geometry MOSFETs (channel lengths greater than one micron, the subthreshold leakage current is usually small enough to be ignored. For short-channel devices, however, this current flow may, in many instances, be significant. In the 3T cell, in which the write transistor is connected to the gate of the storage transistor, the subthreshold leakage current through the write transistor is a primary factor in the rate of discharge of the storage transistor. The greater the leakage current, the faster the cell discharges.

To prevent discharging to a degraded voltage level, the refresh operation is performed on each cell in a memory array at a fixed interval. The time between successive refresh operations is called the refresh interval, and is selected based on physical characteristics of the cell's transistors. The integrity of data in a memory system depends on each cell being able to hold its logic state throughout the duration of the refresh interval.

During manufacture of memory arrays, a test is conducted to insure that each cell meets the specification for the refresh interval. If this test is not performed with a comparatively large subthreshold leakage current, the memory cell could still be susceptible to failure under worst-case leakage conditions. To improve test coverage, it would therefore be desirable to increase the subthreshold leakage current during the refresh interval test of the 3T cell.

SUMMARY OF THE INVENTION

The problem outlined above is in large part solved by a test method in accordance with the present invention. In one embodiment, a method for testing refresh operations of a memory array is provided wherein subthreshold leakage current may be set to near worst-case conditions. The memory array includes a first row of memory cells having a first memory cell configured to store a first memory value, and a second row of memory cells having a second memory cell configured to store a second memory value. The method comprises storing a logic high value to the first memory cell as the first memory value, followed by storing a logic low value to the second memory cell as the second memory value. The method further comprises repeatedly driving a write bit line coupled to both the first and second memory cells at a logic low level for a period of a time equal to a refresh interval corresponding to the first memory cell. Additionally, the method includes subsequently reading the first memory value from the first memory cell. Finally, the method includes indicating that the first memory cell is operating correctly if the first memory value is still equal to a logic high value, or indicating that the first memory value is malfunctioning if the first memory value is equal to a logic low value. Driving the write bit line low may be accomplished by repetitively reading the second memory cell. The same effect may alternately be achieved by repetitively writing a logic low value to the second memory cell. By keeping the write bit line at a logic low level during testing of refresh operations, the subthreshold leakage current through the write transistor of the first memory cell may be increased. This accelerates the discharge of the first memory value, and insures testing is performed near worst-case conditions.

Broadly speaking, the present invention contemplates a method for testing refresh operations of a memory array which includes a first row of memory cells and a second row of memory cells. The first row of memory cells includes a first memory cell configured to store a memory value, and the second row of memory cells includes a second memory cell. The method comprises storing a logic high value in the first memory cell as the memory value and storing a logic low value in the second memory cell. The method further comprises driving a write bit line coupled to the first memory cell and the second memory cell at a logic low level for a time period substantially equal to a designated refresh interval. The method further comprises reading the memory value from the first memory cell, and indicating that the first memory cell is operating correctly in response to the memory value being equal to a logic high value, and indicating that the first memory cell is malfunctioning in response to the memory value being equal to a logic low value.

The present invention further contemplates a method for testing refresh operations of a memory array which includes a first row of memory cells and a second row of memory cells. The first row of memory cells includes a first memory cell configured to store a first memory value, and the second row of memory cells includes a second memory cell configured to store a second memory value. The method comprises storing a first logic state in the first memory cell as the first memory value and storing a second logic state in the second memory cell as the second memory value. The method further comprises repetitively reading the second memory value in the second memory cell for a time period substantially equal to a designated refresh interval for which the first memory cell is being tested. The method also comprises reading the first memory value from the first memory cell upon completing repetitively reading the second memory value in the second memory cell.

The present invention also contemplates a method for testing refresh operations of a memory array which includes a first row of memory cells and a second row of memory cells. The first row of memory cells includes a first memory cell configured to store a first memory value, and the second row of memory cells includes a second memory cell configured to store a second memory value. The method comprises storing a first logic state in the first memory cell as the first memory value and storing a second logic state in the second memory cell as the second memory value. The method further comprises repetitively writing the second memory value in the second memory cell for a time period substantially equal to a designated refresh interval for which the first memory cell is being tested. The method also comprises reading the first memory value from the first memory cell upon completing repetitively writing the second memory value in the second memory cell.

BRIEF DESCRIPTION OF THE DRAWINGS

Other objects and advantages of the invention will become apparent upon reading the following detailed description and upon reference to the accompanying drawings in which.

Figure 1:
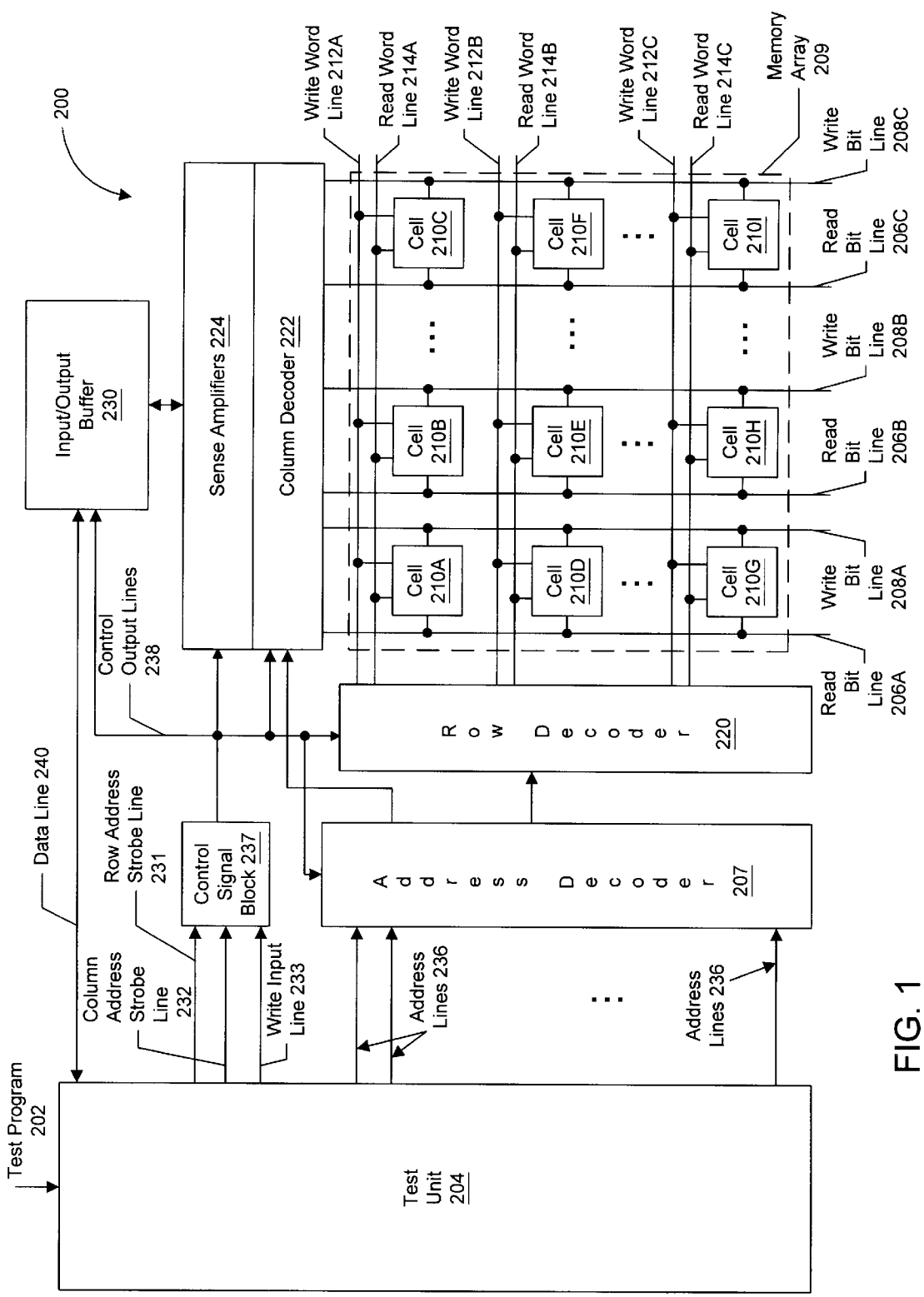
FIG. 1 depicts a memory test configuration including a test unit and a memory array in accordance with one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of a memory test configuration 200 including a memory array 209 and a test unit 204 in accordance with one embodiment of the present invention is shown. As depicted, memory test configuration 200 includes a plurality of cells 210A–210I (referred to collectively as cells 210) which make up memory array 209. Each one of cells 210 is coupled to one of write bit lines 208A–C (write bit lines 208), read bit lines 206A–C (read bit lines 206), write word lines 212A–C (write word lines 212), and read word lines 214A–C (read word lines 214). Memory array 209 is coupled to a row decoder 220 by write word lines 212 and read word lines 214, and a column decoder 222 by read bit lines 206 and write bit lines 208. Row decoder 220 and column decoder 222 are coupled to address decoder 207 and control signal block 237. Control signal block 237 takes as inputs row address strobe line 231, column address strobe line 232, and write input line 233. The outputs of control signal block 237 are control output lines 238, which are coupled to various blocks of logic. Address decoder takes address lines 236 as its inputs. Sense amplifiers 224 are coupled between column decoder 222 and input/output buffer 230. Input/output buffer 230 is coupled to a data line 240 and outputs from control signal block 237. Data line 240, address lines 236, row address line 231, column address line 232 and write input line 233 form the interface to memory array 209, and are all coupled to a test unit 204. Test unit 204 operates in accordance with a test program 202, which may be provided as an input.

Selected cells 210 within memory array 209 may be read or written by proper manipulation of address lines 236, data line 240, row address strobe line 231, column address strobe line 232, and write input line 233. In memory test configuration 200, these signals are driven by test unit 204 in response to test program 202. Certain instructions within test program 202 will specify either read or write memory operations.

For a read access, test unit 204 first drives a row address on address lines 236 along with row address strobe line 231. Write input line 233 is not driven active, indicating a read. Row decoder 220 uses the values conveyed by address decoder 207 to select a single read word line 214. Activating a read word line 214 causes the contents of each of the cells 210 on the selected row to be conveyed on the read bit line corresponding to the cell. Next, test unit 204 drives a column address on address lines 236 along with column address strobe line 232. Column decoder 222 uses the column address to select a single read bit line 206. The sense amplifier connected to the selected read bit line 206 will then convey the value of the selected memory cell to input/output buffer 230. Since the operation is a read, the cell value will be conveyed on data line 240 as an output. Row address strobe line 231 and column address strobe line 232 are then de-asserted in preparation for another access.

For a write access, test unit 204 first drives a row address on address lines 236 along with row address line 231. Write input line 233 is driven active, indicating a write operation. Row decoder 220 uses the values conveyed by address decoder 207 to select a single write word line 212. Next, test unit 204 drives a column address on address lines 236 along with column address strobe line 232 and a data value on data line 240. Column decoder 222 uses the values conveyed by address decoder 207 to select a single write bit line 208. The data value on data line 240 is driven through input/output buffer 230 to one of the sense amplifiers 224. The sense amplifier drives the data value on the write bit line selected by the column address. Thus, a data value is stored at the cell that has both its write word line 212 and its write bit line 208 active. Row address strobe line 231 and column address strobe line 232 are then de-asserted in preparation for another access.

By appropriate coding of test program 202, a variety of tests can be performed on memory array 209 to insure the functionality of cells 210, as well as the coupled word and bit lines. As will be described in further detail below, test unit 204 conducts a refresh interval test on memory array 209 in which a subthreshold leakage current within cells 210 may be increased. Since a comparatively large subthreshold leakage current has an adverse impact on a memory cell's data retention properties, this insures testing is performed near worst-case conditions.

Figure 2:
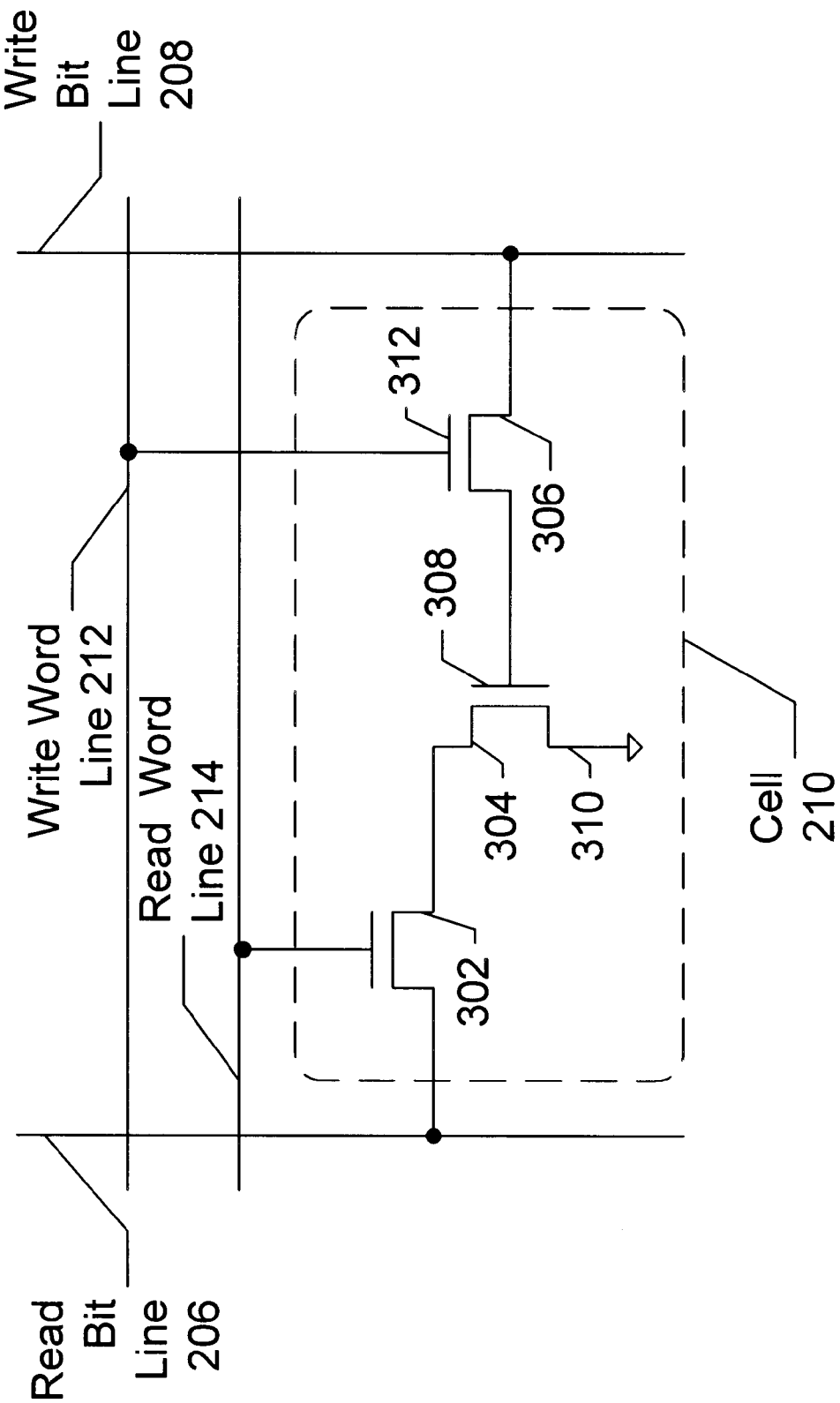
FIG. 2 depicts a three-transistor DRAM cell in accordance with one embodiment of the present invention.

Turning next to FIG. 2, portions of one embodiment of circuitry within memory test configuration 200 are shown in greater detail. Circuit portions corresponding to those of FIG. 2 are numbered identically for simplicity and clarity. FIG. 2 shows a cell 210 which is exemplary of cells 210A–I. Cell 210 includes a read transistor 302 which is coupled to a storage transistor 304, a read word line 214, and a read bit line 206. Storage transistor 304 is further coupled between a write transistor 306 and a reference voltage (in this case, ground). Write transistor 306 is further coupled to a write word line 212 and a write bit line 208.

Cell 210 is one implementation of a three-transistor DRAM cell (3T cell). To store a value to cell 210, write word line 212 is selected while driving the desired value on write bit line 208. Write word line 212 turns on write transistor 306, conveying the value on write bit line 208 to storage transistor 304. The value is stored as a capacitance between gate 308 and source 310 of storage transistor 304.

To read the value stored in cell 210, read bit line 206 is first precharged to a logic high level. Next, read word line 214 is activated, turning on read transistor 302. If a logic high value is stored at the gate of storage transistor 304, this transistor is also on. In this case, read bit line 206 begins to discharge as current flows through read transistor 302 and storage transistor 304 to ground. Sense amplifiers (not shown in FIG. 2) connected to read bit line 206 detect this voltage drop and impress a logic high voltage on the read bit line. Conversely, if a logic low value is stored at the gate of storage transistor 304, this transistor is turned off. Read bit line 206, therefore, has no path to discharge. The sense amplifiers (not shown in FIG. 2) connected to read bit line 206 detect this lack of a voltage drop, and convey a logic low value as output.

Additional circuitry (not shown) may further be provided to implement a refresh function for cell 210. When cell 210 is being refreshed, it cannot be read or written as usual. The refresh logic reads the contents of cell 210, and instead of conveying this value as output, it rewrites this value back to storage transistor 304, restoring the charge.

The data retention properties of cell 210 are affected in large part by the flow of subthreshold leakage current through write transistor 306 during times at which this transistor is off (write word line 212 is not selected). The amount of leakage current in cell 210 is determined by the voltage $V_{GS}$ established between gate 312 and write bit line 208 (connected to the source of write transistor 306). The more negatively biased $V_{GS}$ is, the less subthreshold leakage current will flow. One way to influence the amount of leakage current is to control the voltage $V_S$ on write bit line 208. By increasing the voltage on the write bit line, the subthreshold current is reduced. In one embodiment of cell 210, a 70 mV increase in the voltage on write bit line 208 will reduce the leakage current by an order of magnitude. While a reduced subthreshold leakage is desirable in normal operation of cell 210, it is advantageous to maximize the leakage of the cell when testing its refresh operation. This will insure testing near the worst possible conditions. As will described below, this can be accomplished in cell 210 by driving the write bit line to ground during refresh testing.

Figure 3:
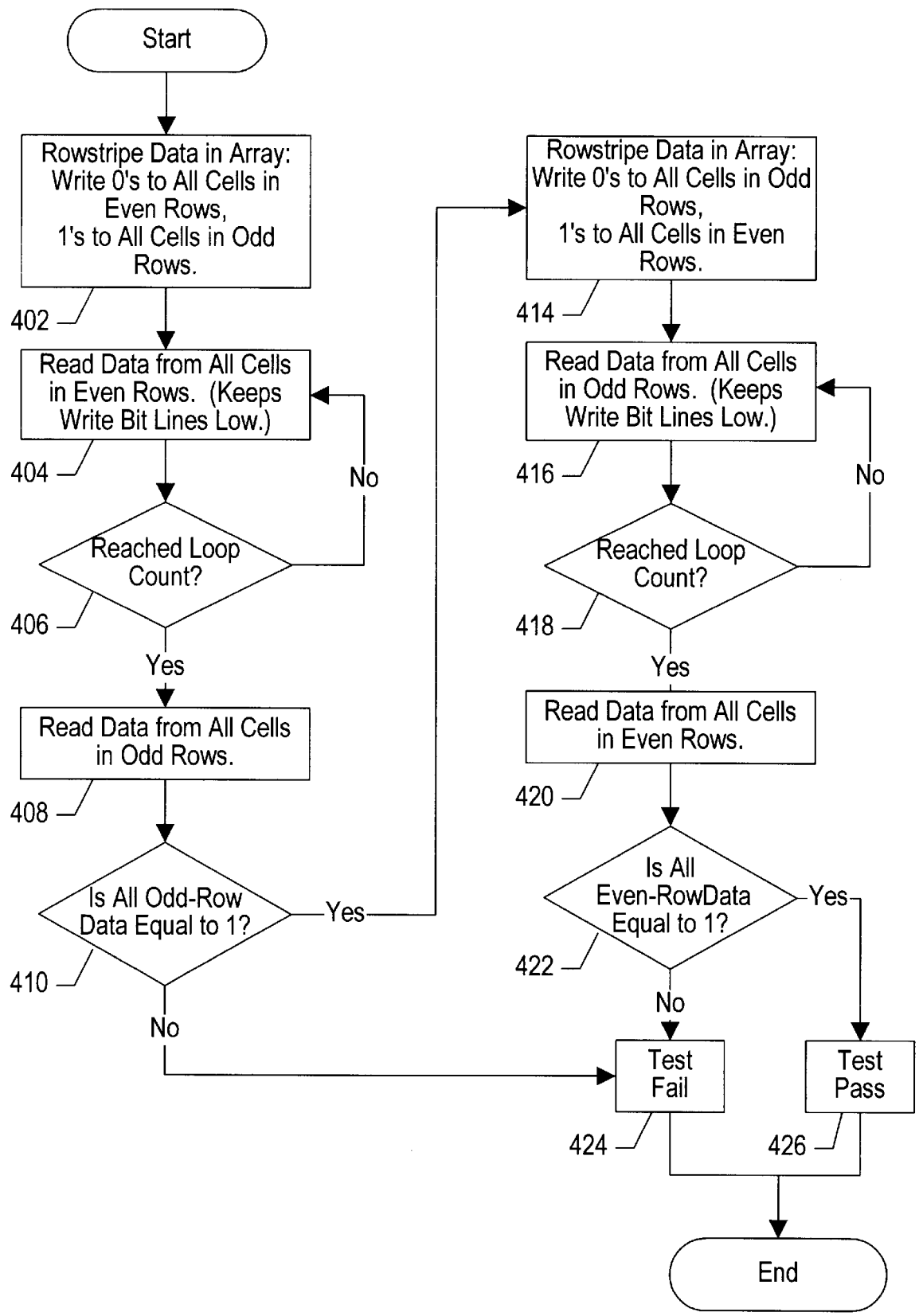
FIG. 3 depicts a methodology for testing the refresh interval of a memory array in accordance with one embodiment of the present invention.

Turning next to FIG. 3, a method 400 for testing the refresh operation of memory array 209 is shown. In a first step 402, data is rowstriped into memory array 209, meaning that all cells in all even rows are written with logic values, or 0's, and all cells in odd rows are written with logic high values, or 1's. Steps 404 and 406 form a loop in which data is repetitively read from cells in even rows. In step 404, data is read from all cells in even rows. In this embodiment of memory array 209, this also has the effect of driving the write bit line at a low level. In step 406, the number of times step 404 has been performed is compared against a predetermined loop count. If the loop count has not been reached, step 404 is repeated. The loop count is selected such that the time for the read operations in step 404 multiplied by the loop count equals a designated time period equal to the refresh interval of the cells being tested. Thus, when the loop count is reached, the time elapsed from commencement of step 404 to commencement of a step 408 is equal to the refresh interval. In step 408, the values of the cells in the odd rows are read from the memory array (these are the cells that were originally written with 1's). In a step 410, the values read in step 408 are checked to see if they are all still equal to 1. If any cells contain 0's, they do not meet the designated refresh interval specification. If such cells are present, a step 424 is performed indicating that the memory array has malfunctioning cells. In one embodiment of memory test configuration 200, the location of these cells may be output by test unit 204.

If all cells in the odd rows of memory array 209 still contain 1's, testing proceeds to a step 414. In step 414, memory array 209 is again rowstriped, but this time 0's are written to the even rows and 1's are written to the odd rows. Steps 416 and 418 form a loop in which data is repetitively read from cells in odd rows. In step 416, data is read from all cells in odd rows, which, as stated above, has the effect of driving all the write bit lines low. In step 418, the number of times step 416 has been performed is compared against a predetermined loop count. If the loop count has not been reached, step 416 is repeated. The loop count is selected such that the time for the read operations in step 416 multiplied by the loop count equals a designated time period equal to the refresh interval of the cells being tested. Thus, when the loop count is reached, the time elapsed from commencement of step 416 to commencement of a step 420 is equal to the refresh interval. In step 420, the values of the cells in the even rows are read from the memory array 209 (these are the cells that were originally written with 1's). In a step 422, the values read in step 420 are checked to see if they are all still equal to 1. If any cells contain 0's, they do not meet the designated refresh interval specification. If such cells are present, a step 424 is performed, indicating that the memory array has malfunctioning cells. In one embodiment of memory test configuration 200, the location of these cells may be output by test unit 204. If no cells are malfunctioning, a step 426 is performed, indicating that the memory cells are operating correctly with regard to the refresh interval.

It is noted that variations of the testing method described above may be employed, particularly with regard to how the write bit line is driven low during the refresh interval. In another embodiment, the write bit line may be driven low by writing 0's to the rows of memory cells not under test (the rows originally written with 0's).

In yet another embodiment, dedicated on-chip circuitry could be employed to keep the write bit line at a logic low level during refresh testing.

Other embodiments may further seek to increase the subthreshold leakage current in cells 210 by performing a relatively long read cycle. Since there is a minimum interval between successive memory operations, control signals such as row address strobe line 231, column address strobe line 232, and write input line 233 are inactive for a short period of time. The write bit line is therefore not being driven low between successive memory accesses. By increasing the duration of the pulses on the row address strobe line 231 and column address line 232, the percentage of time the write bit line is being driven low can be increased. By implementing a relatively long read cycle, the duty cycle of the signal on the write bit line may be increased to a high percentage, such as 95%. In one specific implementation of memory array 209, a repetitively generated 10 os read cycle creates a 99.9% duty cycle. In other embodiments, increased subthreshold current may also be achieved by long write cycles.

Numerous variations and modifications will become apparent to those skilled in the art once the above disclosure is fully appreciated. It is intended that the following claims be interpreted to embrace all such variations and modifications.

What is claimed is:

1. A method for testing refresh operations of a memory array, said memory array including a first row of memory cells and a second row of memory cells, said first row of memory cells including a first memory cell configured to store a memory value, said second row of memory cells including a second memory cell, comprising:

storing a logic high value in said first memory cell as said memory value;

storing a logic low value in said second memory cell;

driving a write bit line coupled to said first memory cell and said second memory cell at a logic low level for a time period substantially equal to a designated refresh interval;

reading said memory value from said first memory cell;

indicating that said first memory cell is operating correctly in response to said memory value being equal to a logic high value; and indicating that said first memory cell is malfunctioning in response to said memory value being equal to a logic low value.

2. The method for testing refresh operations of a memory array as recited in claim 1 wherein said reading said memory value is performed after storing said logic high value in said first memory cell and before storing another logic value in said first cell.

3. The method for testing refresh operations of a memory array as recited in claim 1 wherein said driving said write bit line low is performed by reading said second memory cell.

4. The method for testing refresh operations of a memory array as recited in claim 1 wherein said driving said write bit line low is performed by writing said second memory cell with a logic low value.

5. The method for testing refresh operations of a memory array as recited in claim 1 wherein said first row and said second row each contain a plurality of additional memory cells.

6. The method for testing refresh operations of a memory array as recited in claim 5 wherein said memory array contains an additional plurality of rows.

7. The method for testing refresh operations of a memory array as recited in claim 1 wherein said first memory cell and said second memory cells are three-transistor DRAM cells.

8. A method for testing refresh operations of a memory array, said memory array including a first row of memory cells and a second row of memory cells, said first row of memory cells including a first memory cell configured to store a first memory value, said second row of memory cells including a second memory cell configured to store a second memory value, comprising:

storing a first logic state in said first memory cell as said first memory value;

storing a second logic state in said second memory cell as said second memory value;

repetitively reading said second memory value in said second memory cell for a time period substantially equal to a designated refresh interval for which said first memory cell is being tested;

reading said first memory value from said first memory cell upon completing said repetitively reading said second memory value in said second memory cell.

9. The method for testing refresh operations of a memory array as recited in claim 8 wherein said reading said memory value is performed after storing said logic high value in said first memory cell and before storing another logic value in said first cell.

10. The method for testing refresh operations of a memory array as recited in claim 8, wherein upon said reading said first memory value from said first memory cell, determining a state of said first memory value in said first memory cell.

11. The method for testing refresh operations of a memory array as recited in claim 10, wherein upon said determining said state of said first memory value in said first memory cell, indicating whether said first memory cell is operating correctly depending upon said state of said first memory value.

12. The method for testing refresh operations of a memory array as recited in claim 8 wherein said first memory cell and said second memory cells are three-transistor DRAM cells.

13. A method for testing refresh operations of a memory array, said memory array including a first row of memory cells and a second row of memory cells, said first row of memory cells including a first memory cell configured to store a first memory value, said second row of memory cells including a second memory cell configured to store a second memory value, comprising:

storing a first logic state in said first memory cell as said first memory value;

storing a second logic state in said second memory cell as said second memory value;

repetitively writing said second memory value in said second memory cell with a given logic state for a time period substantially equal to a designated refresh interval for which said first memory cell is being tested;

reading said first memory value from said first memory cell upon completing said repetitively writing said second memory value in said second memory cell.

14. The method for testing refresh operations of a memory array as recited in claim 13 wherein said reading said memory value is performed after storing said logic high value in said first memory cell and before storing another logic value in said first cell.

15. The method for testing refresh operations of a memory array as recited in claim 13, wherein upon said reading said first memory value from said first memory cell, determining a state of said first memory value in said first memory cell.

16. The method for testing refresh operations of a memory array as recited in claim 15, wherein upon said determining said state of said first memory value in said first memory cell, indicating whether said first memory cell is operating correctly depending upon said state of said first memory value.

17. The method for testing refresh operations of a memory array as recited in claim 13 wherein said first memory cell and said second memory cells are three-transistor DRAM cells.

* * * * *